United States Patent [19]

Messerschmitt

[11] 4,145,667
[45] Mar. 20, 1979

[54] PHASE LOCKED LOOP FREQUENCY SYNTHESIZER USING DIGITAL MODULO ARITHMETIC

[75] Inventor: David G. Messerschmitt, Middletown, N.J.

[73] Assignee: Bell Telephone Laboratories, Incorporated, Murray Hill, N.J.

[21] Appl. No.: 832,831

[22] Filed: Sep. 13, 1977

[51] Int. Cl.$^2$ ............................................. H03B 3/04
[52] U.S. Cl. ......................................... 331/16; 331/25
[58] Field of Search ..................... 331/1 A, 18, 25, 16, 331/14

[56] References Cited

U.S. PATENT DOCUMENTS

| | | | |
|---|---|---|---|
| 3,555,446 | 1/1971 | Braymer | 331/16 |
| 3,582,810 | 6/1971 | Gillette | 331/10 |
| 4,034,302 | 7/1977 | May, Jr. | 328/39 |

OTHER PUBLICATIONS

Gillette, "The Digiphase Synthesizer", Frequency Technology, Aug. 1969, pp. 25-29.

*Primary Examiner*—Siegfried H. Grimm
*Attorney, Agent, or Firm*—Richard J. Roddy

[57] ABSTRACT

A reference source of digital pulses of a first frequency $f_1$ is coupled to the input of a frequency synthesizer which is capable of providing a second frequency $f_2$ output signal. The second frequency is related to the first frequency by a predetermined, rational fraction (e.g., as $f_2=(M/N)f_1$). The synthesizer includes a phase control unit comprising an adder by way of which a first number N is added each sample period to a remainder, the sum output of the adder being operated upon modulo a second number M, e.g., by dividing by M and discarding a resultant quotient to obtain a remainder. The remainder, having a value between zero and M-1, is compared to a prefixed signal, illustratively the largest integer in M/2. If the remainder is less than the prefixed signal, a first logic state control signal is provided to a control system; else a second logic state signal is so provided. The alternation between the first and second logic states is such that M pulses of the second frequency occur for every N pulses of the first frequency. Thereby, the second frequency is synthesized responsive to the first.

4 Claims, 2 Drawing Figures

PHASE LOCKED LOOP FREQUENCY SYNTHESIZER USING DIGITAL MODULO ARITHMETIC

BACKGROUND OF THE INVENTION

This invention relates to frequency synthesizers and, more particularly, to a digital frequency synthesizer for producing a second digital signal related to a first digital signal by virtually any predetermined, rational fraction.

Frequency synthesizers are well known in the art. For example, U.S. Pat. No. 3,555,446 issued to N. B. Braymer on Jan. 12, 1971 discloses a synthesizer for producing a second frequency signal $f_2$ which is in a selected numerical relationship with a first frequency signal $f_1$. The cited patent is typical of the genre and includes a voltage control oscillator (VCO) coupled to a phase-locked loop for producing the second frequency from the first frequency in a relationship in the form $f_2 = Lf_1$.

In the Bell system, a 16.384 MHz signal is typically employed in electronic switching equipment and is related to a 1.544 MHz T-carrier signal by the predetermined rational fraction 2048/193, or, of course, by its inverse. Hence, in terms of the cited patent, the relationship between the second and the first frequency is approximately $L = 10.61139896373056...$. Unfortunately, it does not appear possible to produce a second frequency in such a relationship to a first frequency when using the teachings of the cited patent.

U.S. Pat. No. 4,034,302 issued to C. J. May, Jr. on July 5, 1977 discloses a smooth sequence generator (SSG) that is capable of dividing a uniform pulse sequence by virtually any proper, predetermined, rational fraction. Therein disclosed is an illustrative smooth sequence generator for producing a second frequency signal of 6.176 MHz from a 16.384 MHz signal. The illustrative predetermined relationship is 193/512. Notwithstanding, producing a smooth sequence from a uniform pulse stream typically necessitates accurate and, hences, expensive components.

Accordingly, an object of the present invention is to provide a relatively inexpensive digital frequency synthesizer for producing a second frequency signal related to a first frequency signal.

SUMMARY OF THE INVENTION

This and other objects are obtained in accordance with the principles of my invention by improved apparatus for producing a second digital signal related to a first digital signal by a predetermined, rational fraction. According to one aspect of my invention, a first number is added to a digital value related to the first number and the sum is accumulated for providing a modulo remainder thereof, the remainder to be compared with the value of a function of a second number. Responsive to the comparison, an alternating control signal is provided for extending the synthesized second frequency signal to an output terminal. According to another aspect of my invention, the second frequency signal is related to the first frequency signal according to a ratio of the first and second numbers.

BRIEF DESCRIPTION OF THE DRAWINGS

The invention will be more fully appreciated from the following detailed description when the same is considered in connection with the accompanying drawings in which.

DETAILED DESCRIPTION

Figure 1:
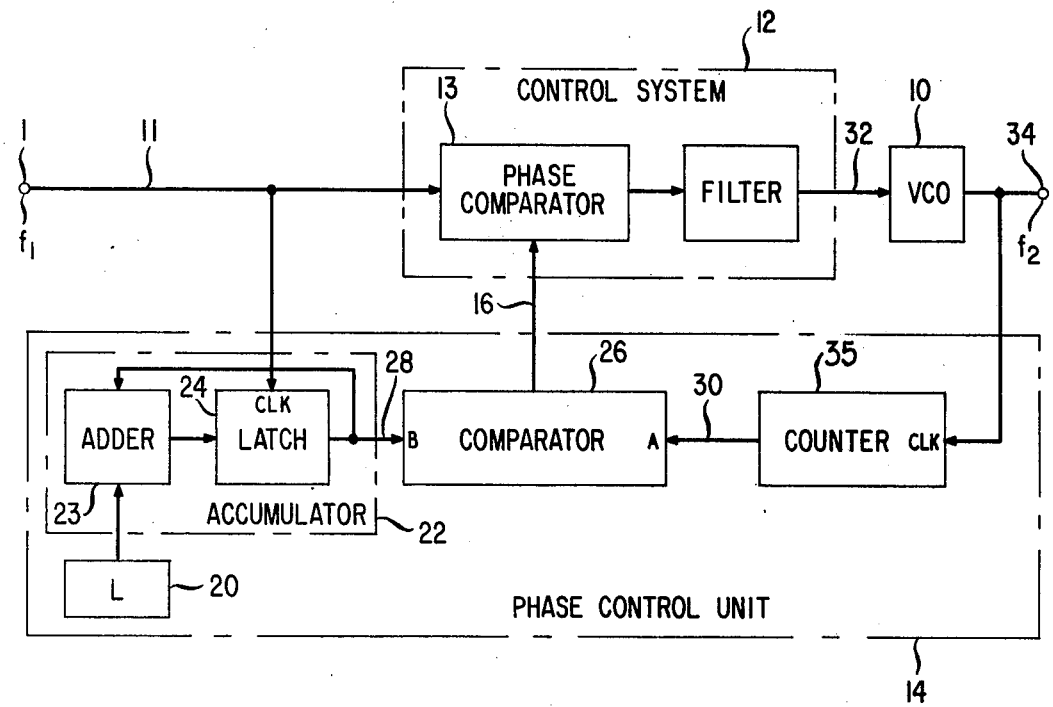
FIG. 1 illustrates a prior art digital synthesizer.

FIG. 1 illustrates a frequency synthesizer of the type disclosed in the aforecited U.S. Pat. No. 3,555,446. In particular, a periodic reference signal of a first frequency $f_1$ is provided to input terminal 1 and extended jointly to a first input of phase comparator 13 of control system 12 and a CLK input of accumulator 22, the latter located within phase control unit 14. Generally, the signal that is provided from an output of voltage control oscillator 10 to output terminal 34 as a second frequency signal $f_2$ is jointly provided to a CLK clock input of counter 35, the latter also within control unit 14. Essentially, phase control unit 14 extends a control signal over lead 16 to a second input of phase comparator 13 for attaining or preserving the desired phase. As to phase control unit 14, the relationship L between the first frequency $f_1$ and the second frequency $f_2$ is stored in apparatus 20. The relationship L usually includes both integer and fractional parts, which are periodically added by adder 23 to an output of latch 24 within accumulator 22. The periodic addition occurs responsive to a pulse of first frequency signal $f_1$. To develop the control signal supplied over lead 16, the integer part contents of accumulator 22 are periodically compared with the contents of counter 35, which counter manifests total phase by tallying cycles of the output of voltage control oscillator 10. An output of accumulator 22 is extended over lead 28 to a B input of comparator 26 while the contents of counter 35 are extended over lead 30 to an A input of comparator 26. If the A value is greater than the B value, a logic one is extended to control system 12; else a logic zero is so extended. Responsive to the thus supplied control signal, a corrective signal may be extended to the VCO 10 over lead 32 so as to attain or preserve the desired second frequency signal $f_2$ at terminal 34. As aforementioned, in the prior art, the first and second signals are related according to the mathematical equation $f_2 = Lf_1$, where L usually includes integer and fractional parts. Unfortunately, as the fractional part of L becomes large, the precision of adder 23 usually must correspondingly increase. Hence the cost of the prior art digital synthesizer also tends to increase.

Figure 2:
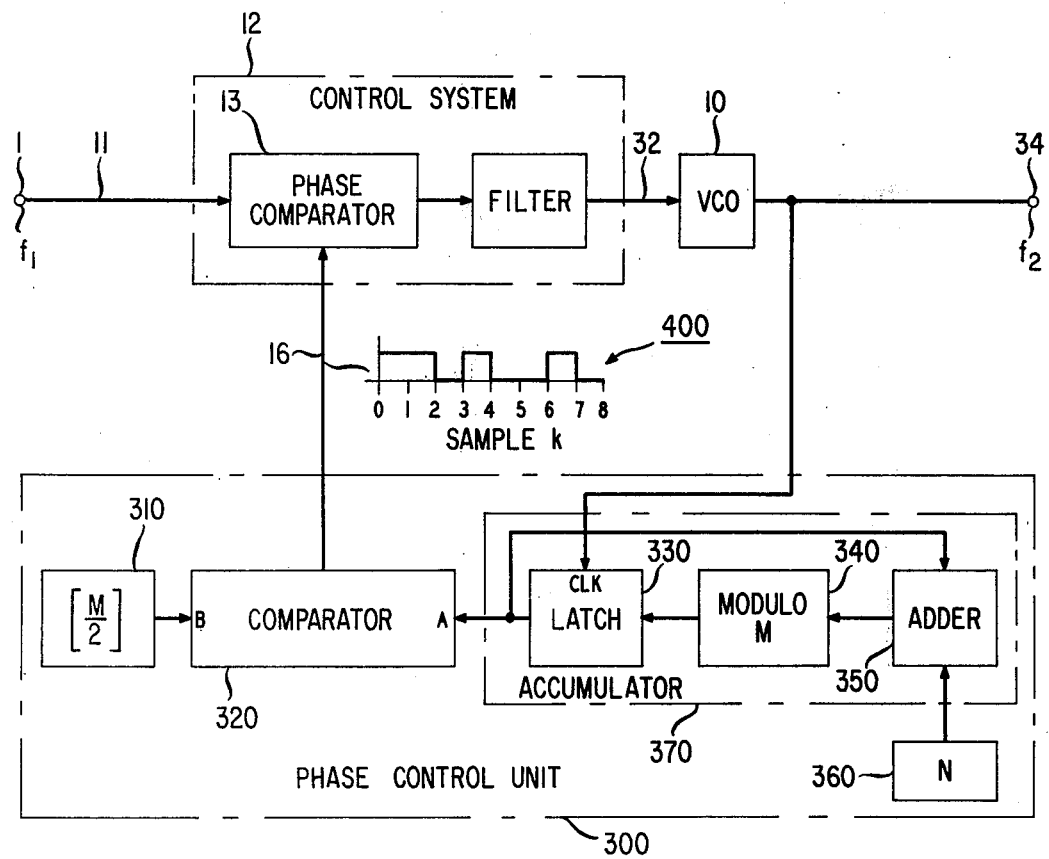
FIG. 2 shows, in schematic form, illustrative apparatus incorporating the principles of my invention.

FIG. 2 illustrates an improved digital synthesizer in accord with the principles of my invention. In my illustrative embodiment, phase control unit 14 of FIG. 1 is replaced by an improved phase control unit 300 of FIG. 2. Otherwise, the operation of the apparatus illustrated in FIG. 2 parallels that aforedescribed for FIG. 1. Directing attention to phase control unit 300, virtually any predetermined, rational fractional relationship between $f_2$ and $f_1$ is possible. In our illustrative embodiment, the relationship is of the form $f_2 = (M/N)f_1$. Thereby, my synthesizer allows for a relationship not possible with the apparatus of the '446 patent. In ease of discussion, assume a first number N is less than a second number M. Hence, the synthesized second frequency $f_2$ would be greater than the first frequency $f_1$. Notwithstanding the illustrative relationship, it should be clear to the skilled art worker that phase control 300 could be situated with input terminal 1 being extended to the CLK input of latch 330, with lead 16 being extended to the first input to phase comparator 13 and with the output of VCO 10 being extended to the second input of comparator 13. If so situated, my improved synthesizer would produce a signal having a frequency $f_2$ less than the first reference frequency. Returning to FIG. 2, the first number N is numerically added by adder 350 to the value at an output of latch 330. The sum output of adder 350 is then supplied to modulo M apparatus 340 for providing a remainder to an output thereof. The remainder may be obtained by apparatus for dividing the sum by M and for discarding the quotient. The remainder will, of course, have a value between zero and (M-1). That remainder value is then loaded into latch 330 responsive to the next pulse of the second frequency $f_2$ for extension to an A input of comparator 320. The loading of a standard latch, such as latch 330, typically occurs upon detection of a positive transition of a pulse at its clock input. Hence, inasmuch as the second frequency signal is extended from an output of VCO 10 to a CLK clock input of latch 330, the output of modulo M apparatus 340 is loaded into latch 330 responsive to the next positive transition of a pulse of the $f_2$ signal. Also, a prefixed signal, here illustratively a signal having a value equal to the largest integer in M/2 is extended from apparatus 310 to a B input of comparator 320. If the A input is less than the B input, a logic one control signal is extended over lead 16 to control system 12; else a logic zero is so extended. Responsive to the control signal, control system 12 supplies a corrective signal over lead 32 to VCO 10 for adjusting its output to attain or preserve the second frequency $f_2$ signal.

As a numerical example of our improved digital frequency synthesizer, assume N=3 and M=8 as may well be the case in producing an 8,000 Hz second frequency signal from a 3,000 Hz first frequency signal. In producing such a signal, it should be clear that during the time period in which the first frequency signal includes three pulses, the second frequency signal includes eight pulses. Our numerical example is partially summarized in the five column table below:

The symbol k identifies a sample period. Hence the sample period is the time duration between pulses of the second frequency signal. To explain the table, let the sample periods be labeled k=0, 1, 2, . For a sample period, N (=3) is loaded from apparatus 360 and added by adder 350 to the output of latch 330. For sample period k=0, assume the output of latch 330 is zero. The sum outputs of adder 350 are for consecutive sample periods, the values set forth in the second column of the table. The output of adder 350 is supplied to modulo M apparatus 340 for providing the remainder to an output thereof. As aforementioned, the remainder has a value ranging between zero and (M-1=) seven. Here remainders are listed by sample period in the third column of the table. It should be clear that the remainders repeat for each group of eight sample periods. The remainder is then loaded into latch 330 for extension to the A input of comparator 320. The output of latch 330 (and hence the A input to comparator 320) is set forth in the fourth column. Of course, the output of latch 330 is equal to the output of Modulo M apparatus 340, delayed one sample period.

Modulo M apparatus 340 may be any straight-forward apparatus for dividing the input by M and extending the remainder after the division to an output thereof. Of course, implementation of division circuitry may well be done by use of addition/subtraction operations. Inasmuch as M (=8) the output of apparatus 310 has a value four extended to the B input of comparator 320. As previously mentioned, the output control signal of control unit 300, as provided to lead 16, is a logic one if the value provided to the A input of comparator 320 is less than that provided to its B input; else the output control signal is logic zero. Accordingly, the logic state of the control signal on lead 16 is illustrated in the fifth column of the above table. Also, the control signal resulting from our numerical example is shown in FIG. 2 as timing signal 400. It should be noted that indeed my improved frequency synthesizer has produced eight pulses in the second frequency for every three pulses of the first frequency.

It should be clear from the above that the largest number to be added by adder 350 would result in a sum $(M-1)+N$. Hence, unlike the prior art, an upper bound on the sum is determinable. As a result, a less precise adder and hence a relatively inexpensive synthesizer obtains in accord with the principles of my invention.

What I claim is:

1. A frequency synthesizer including
   a first terminal adapted for receiving a first frequency signal,
   first means responsive to said first frequency signal for extending a synthesized second frequency signal to an output terminal;
   said first extending means including a control unit responsive to one of said frequency signals for providing a control signal said control unit including an accumulator, said accumulator including apparatus for adding a first number to an output of said accumulator to obtain a sum, and said first extending means including a control system responsive to said control signal and to the other one of said frequency signals for controlling said second frequency signal and CHARACTERIZED IN THAT said synthesizer comprises:
   means for providing a modulo remainder of said sum, said remainder being provided modulo a second number,
   second means responsive to said one of said frequency signals for extending said remainder to said output of said accumulator,
   means for comparing said extended remainder to a prefixed signal, said prefixed signal being equal to the value of a function of said second number, and
   third means responsive to said comparing means for extending said control signal to said control system.

2. The apparatus defined in claim 1 wherein said second frequency signal is related to said first frequency signal according to a ratio of said first and said second numbers.

3. The apparatus defined in claim 2 wherein said ratio may be a predetermined rational fraction.

4. The apparatus defined in claim 1 wherein said remainder comparison means includes apparatus for comparing said remainder to said prefixed signal, said prefixed signal being equal to the largest integer within the value of one-half said second number.

* * * * *

UNITED STATES PATENT AND TRADEMARK OFFICE
CERTIFICATE OF CORRECTION

PATENT NO. : 4,145,667
DATED : March 20, 1979
INVENTOR(S) : David G. Messerschmitt It is certified that error appears in the above—identified patent and that said Letters Patent are hereby corrected as shown below:

Column 3, line 40, after "below:" insert the following table:--

| k | Output of Adder 350 | Output of Modulo M 340 | Output of Latch 330 (A input of Comparator 320) | Signal on Lead 16 |
|---|---|---|---|---|
| 0 | 3 | 3 | 0 | 1 |
| 1 | 6 | 6 | 3 | 1 |
| 2 | 9 | 1 | 6 | 0 |
| 3 | 4 | 4 | 1 | 1 |
| 4 | 7 | 7 | 4 | 0 |
| 5 | 10 | 2 | 7 | 0 |
| 6 | 5 | 5 | 2 | 1 |
| 7 | 8 | 0 | 5 | 0--. |

Column 3, line 44, delete "k=0, 1, 2," and substitute therefor --k=0, 1, 2, 3...--.

Signed and Sealed this

Eighteenth Day of September 1979

[SEAL]

Attest:

Attesting Officer

LUTRELLE F. PARKER
Acting Commissioner of Patents and Trademarks